United States Patent
Yazdani (10) Patent No.: US 9,893,004 B2
(45) Date of Patent: Feb. 13, 2018

(54) SEMICONDUCTOR INTERPOSER INTEGRATION

(71) Applicant: BroadPak Corporation, San Jose, CA (US)

(72) Inventor: Farhang Yazdani, Santa Clara, CA (US)

(73) Assignee: BroadPak Corporation, San Jose, CA (US)

(*) Notice: Subject to any disclaimer, the term of this patent is extended or adjusted under 35 U.S.C. 154(b) by 0 days.

(21) Appl. No.: 14/717,798

(22) Filed: May 20, 2015

(65) Prior Publication Data

US 2015/0255434 A1 Sep. 10, 2015

Related U.S. Application Data (63) Continuation-in-part of application No. 13/192,217, filed on Jul. 27, 2011.

(60) Provisional application No. 62/002,794, filed on May 24, 2014.

(51) Int. Cl.
*H05K 1/18* (2006.01)
*H01L 23/498* (2006.01)
(Continued)

(52) U.S. Cl.
CPC ...... *H01L 23/49827* (2013.01); *H01L 21/486* (2013.01); *H01L 21/52* (2013.01); *H01L 23/04* (2013.01); *H01L 23/3107* (2013.01); *H01L 23/473* (2013.01); *H01L 23/49833* (2013.01); *H01L 23/49838* (2013.01); *H01L 23/573* (2013.01); *H01L 23/66* (2013.01); *H01L 25/0652* (2013.01); *H01L 25/0657* (2013.01); *H01L 25/18* (2013.01); *H01L 25/50* (2013.01);
(Continued)

(58) Field of Classification Search
CPC ....... H01L 2924/00; H01L 2924/10253; H01L 2924/30107; H01L 21/486; H01L 21/52; H01L 2224/48227; H01L 2225/06513; H01L 2225/06517; H01L 2225/06527; H01L 2225/06541; H01L 2225/06548; H01L 2225/06572
See application file for complete search history.

(56) References Cited

U.S. PATENT DOCUMENTS

5,128,831 A 7/1992 Fox, III et al.
5,898,909 A 4/1999 Yoshihara et al.
(Continued)

*Primary Examiner* — Yuriy Semenenko
(74) *Attorney, Agent, or Firm* — Aslan Law, P.C.

(57) ABSTRACT

Integrated circuits are described which directly connect a semiconductor interposer to a motherboard or printed circuit board by way of large pitch connections. A stack of semiconductor interposers may be connected directly to one another by a variety of means and connected to a printed circuit board through only a ball grid array of solder bumps. The stack of semiconductor interposers may include one or more semiconductor interposers which are shifted laterally to enable directly electrical connections to intermediate semiconductor interposers. The top semiconductor interposer may have no electrical connections on the top to increase security by making electrical "taps" much more difficult. An electrically insulating layer may be incorporated between adjacent semiconductor interposers and cavities or air gaps may also be included within one or more semiconductor interposers.

14 Claims, 11 Drawing Sheets (51) Int. Cl.
*H01L 25/065* (2006.01)
*H01L 23/66* (2006.01)
*H01L 21/48* (2006.01)
*H01L 21/52* (2006.01)
*H01L 23/04* (2006.01)
*H01L 23/31* (2006.01)
*H01L 23/473* (2006.01)
*H01L 25/18* (2006.01)
*H01L 25/00* (2006.01)
*H01L 23/00* (2006.01)

(52) U.S. Cl.
CPC .... *H01L 24/48* (2013.01); *H01L 2224/48227* (2013.01); *H01L 2225/06513* (2013.01); *H01L 2225/06517* (2013.01); *H01L 2225/06527* (2013.01); *H01L 2225/06541* (2013.01); *H01L 2225/06548* (2013.01); *H01L 2225/06572* (2013.01); *H01L 2924/00014* (2013.01); *H01L 2924/10253* (2013.01); *H01L 2924/19041* (2013.01); *H01L 2924/30107* (2013.01); *Y10T 29/53174* (2015.01); *Y10T 29/53178* (2015.01); *Y10T 29/53183* (2015.01)

(56) References Cited

U.S. PATENT DOCUMENTS

| | | | |
|---|---|---|---|
| 6,376,769 B1 * | 4/2002 | Chung | B32B 3/08 174/260 |
| 7,317,256 B2 | 1/2008 | Williams et al. | |
| 7,474,540 B1 | 1/2009 | Dang et al. | |
| 7,535,105 B2 * | 5/2009 | Voldman | H01L 23/60 257/758 |
| 8,014,166 B2 | 9/2011 | Yazdani | |
| 9,093,396 B2 | 7/2015 | Lee | |
| 2004/0012938 A1 | 1/2004 | Sylvester et al. | |
| 2005/0061545 A1 | 3/2005 | Rosenau et al. | |
| 2005/0184825 A1 | 8/2005 | Oran | |
| 2006/0001179 A1 * | 1/2006 | Fukase | H01L 23/147 257/778 |
| 2006/0249302 A1 | 11/2006 | Hall et al. | |
| 2006/0273455 A1 | 12/2006 | Williams et al. | |
| 2007/0029646 A1 * | 2/2007 | Voldman | H01L 23/60 257/662 |
| 2007/0045796 A1 * | 3/2007 | Ye | H01L 21/561 257/678 |
| 2007/0235850 A1 * | 10/2007 | Gerber | H01L 21/4853 257/678 |
| 2008/0265399 A1 | 10/2008 | Chao | |
| 2008/0296697 A1 * | 12/2008 | Hsu | H01L 23/49827 257/379 |
| 2009/0267238 A1 * | 10/2009 | Joseph | H01L 23/49833 257/777 |
| 2010/0008058 A1 | 1/2010 | Saen et al. | |
| 2010/0315787 A1 | 12/2010 | Li et al. | |
| 2011/0019368 A1 | 1/2011 | Andry et al. | |
| 2013/0286620 A1 | 10/2013 | Colussi et al. | |
| 2014/0035114 A1 | 2/2014 | Gogoi et al. | |
| 2015/0287672 A1 | 10/2015 | Yazdani | |
| 2016/0126174 A1 | 5/2016 | Shen et al. | |
| 2016/0372448 A1 | 12/2016 | Yazdani | |

* cited by examiner

SEMICONDUCTOR INTERPOSER INTEGRATION

CROSS-REFERENCES TO RELATED APPLICATIONS

The present application claims benefit under 35 USC 119 (e) of U.S. Provisional Application No. 62/002,794 filed May 24, 2014, entitled "DIRECT INTEGRATION OF SILICON INTERPOSER ON PCB", the content of which is incorporated herein by reference in its entirety.

The present application claims benefit and is a continuation-in-part of application Ser. No. 13/192,217 filed Jul. 27, 2011, entitled "STACKING INTEGRATED CIRCUITS CONTAINING SERIALIZER AND DESERIALIZER BLOCKS USING THROUGH SILICON VIA", the content of which is incorporated herein by reference in its entirety.

FIELD

The subject matter herein relates to packaging semiconductor devices.

BACKGROUND

The packaging of electronic devices is becoming more important as demands increase for miniaturization, speed, improved reliability, weight reduction and security. A variety packages are under development such as a die-scale package, at a wafer level; and a die stack-type package. Die have been attached to an interposer to mount the die onto a printed circuit board (PCB) through an organic package substrate to translate the fine geometries of the interposer to the much larger spacing of the printed circuit board. An increasing number of conductive pads of the printed circuit board must be coordinated with more bonding pads on the semiconductor die to improve input/output (I/O) throughput.

Figure 1A:
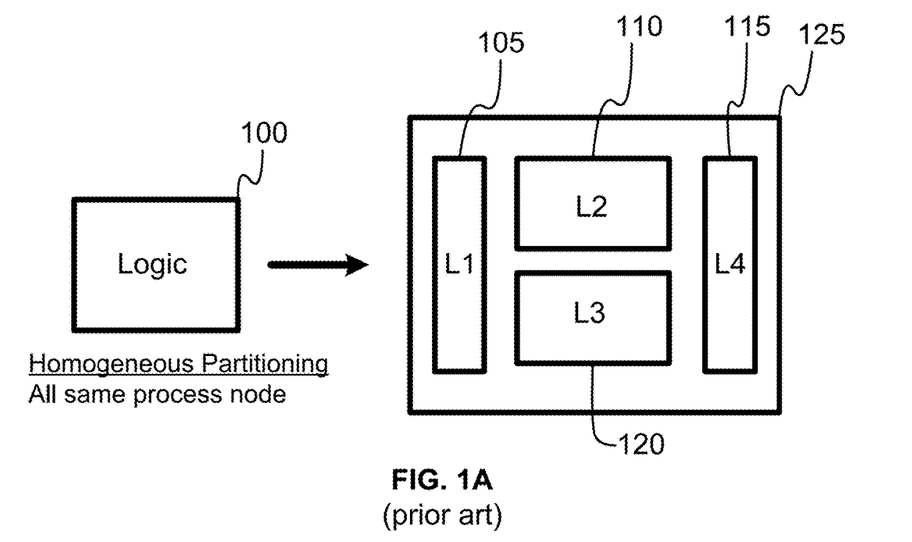
FIG. 1A is a top-view schematic of homogeneous partitioning according to the prior art.
Figure 1B:
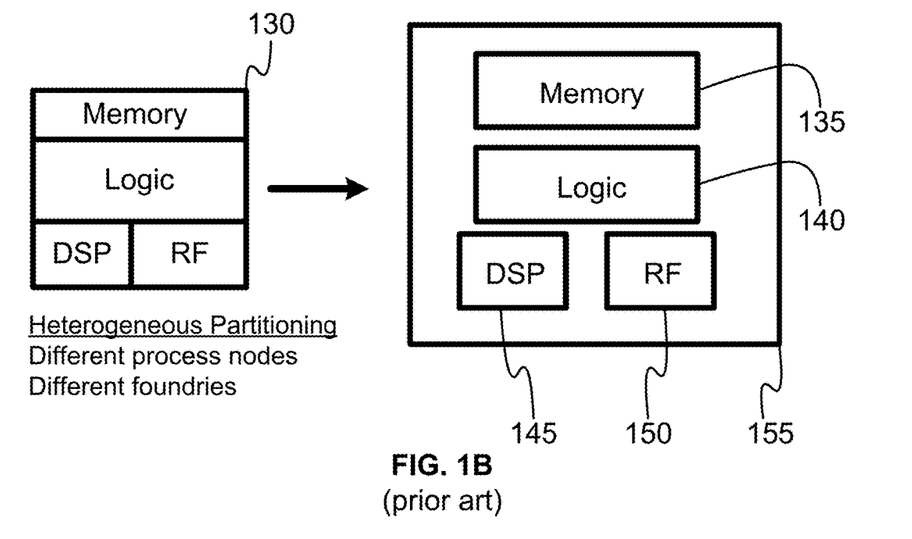
FIG. 1B is a top-view schematic of heterogeneous partitioning according to the prior art.

As Moore's law approaches its decrescendo and the cost per transistor increases below the 22 nm node, device makers are seeking alternative solutions to stay competitive. 2.5D/3D heterogeneous integration has become an alternative solution to achieve higher yield, shorter interconnect length, shorter delays, reduced power, smaller footprint, reduced weight and higher performance. In homogeneous 2.5D/3D integration approach, as illustrated in FIG. 1A, a single chip 100 is partitioned into number of smaller chips (105, 110, 115, 120). Smaller chips (105, 110, 115, 120) are then assembled onto interposer 125 and wired together to form an integrated circuit. FIG. 1B shows a heterogeneous 2.5D/3D integration approach, a single chip 130 includes a number of circuitry blocks including memory 135, logic 140, DSP 145, and RF 150 manufactured separately and mounted on interposer 155 and wired together to form an integrated circuit. Smaller chips (135, 140, 145, 150) may be manufactured by different foundries and may have different process nodes selected for performance, availability and/or cost reasons.

The semiconductor industry has been transitioning from the traditional 2D monolithic approach to the 2.5D/3D heterogeneous approach at a much slower rate than expected. The slow acceptance has arisen due to the high cost. The high cost has resulted from difficult manufacturing procedures, poor reliability and low yield.

Devices are needed which lower the cost per transistor and integrated circuit in multi-level packages.

SUMMARY

Integrated circuits are described which directly connect a semiconductor interposer to a printed circuit board or motherboard by way of large pitch connections such as ball grid arrays (BGA). A stack of semiconductor interposers may be connected directly to one another by a variety of means and connected to a printed circuit board through only a ball grid array of solder bumps. The stack of semiconductor interposers may include one or more semiconductor interposers which are shifted left or right to enable wirebond connections or copper pillar connections to be made directly to intermediate semiconductor interposers which would otherwise only make electrical connections to the semiconductor interposer directly above or below. The top semiconductor interposer may have no electrical connections on the top to increase security by making electrical "taps" much more difficult. An electrically insulating layer may be incorporated between adjacent semiconductor interposers and cavities or air gaps may also be included within one or more semiconductor interposers to improve cooling and/or mount additional circuit elements.

Embodiments disclosed herein pertain to electronic packages which include a printed circuit board. The embodiments further include a first semiconductor interposer electrically coupled to the printed circuit board by a first plurality of electrical connections. The first semiconductor interposer includes a first plurality of through substrate vias perpendicular to the major plane of the first semiconductor interposer and passing through the entire thickness of the first semiconductor interposer. The first through substrate vias are electrically connected to a portion of the first plurality of electrical connections. A spacing between the first semiconductor interposer and the printed circuit board may be less than 800 μm. The embodiments further include at least one monolithic circuit electrically coupled to the first semiconductor interposer by a second plurality of electrical connections.

The second plurality of electrical connections may include one of thermo-compression bonds, copper pillars and solder bumps. A spacing between the at least one monolithic circuit and the at least first semiconductor interposer may be less than 150 μm. A first pitch of the first plurality of electrical connections may be between 200 μm and 3 mm. A second pitch of the second plurality of electrical connections may be between 10 μm and 100 μm. The at least one monolithic circuit may include a plurality of integrated circuits. The at least one monolithic circuit may include a second semiconductor interposer.

Embodiments disclosed herein pertain to electronic packages including a first semiconductor interposer. The first semiconductor interposer includes a first plurality of through substrate vias perpendicular to the major plane of the first semiconductor interposer and passing through the entire thickness of the first semiconductor interposer. The embodiments further include a second semiconductor interposer electrically coupled to the first semiconductor interposer by a second plurality of electrical connections. The embodiments further include a third semiconductor interposer electrically coupled to the second semiconductor interposer. The embodiments further include a top semiconductor interposer electrically coupled to the third semiconductor interposer.

Each of the first semiconductor interposer, the second semiconductor interposer, the third semiconductor interposer and the top semiconductor interposer may include silicon. The third semiconductor interposer may be laterally shifted relative to both the first semiconductor interposer and the top semiconductor interposer to form an interposer overhang portion. A wirebond attachment may be disposed between the interposer overhang portion and the printed circuit board to provide additional electrical connections complementing electrical connections between the third semiconductor interposer and the second semiconductor interposer and between the third semiconductor interposer and the top semiconductor interposer. The second semiconductor interposer may be also laterally shifted relative to the first semiconductor interposer and the top semiconductor interposer to form a second interposer overhang portion. A wirebond attachment may be disposed between the second interposer overhang portion and the interposer overhang portion. A spacing between the second semiconductor interposer and the first semiconductor interposer may be less than 150 μm. The top semiconductor interposer may have no through substrate vias and no electrical connections on top. The top semiconductor interposer may have electrical routing circuitry on a bottom of the top semiconductor interposer. At least one of the first semiconductor interposer, the second semiconductor interposer or the third semiconductor interposer may have a cavity configured to pass a cooling fluid along a major plane of the interposer. At least one of the first semiconductor interposer, the second semiconductor interposer or the third semiconductor interposer may have a cavity configured to accommodate at least one of additional circuit elements or additional wirebond electrical connections. All electrical connections between the first semiconductor interposer and the second semiconductor interposer, between the second semiconductor interposer and the third semiconductor interposer, and between the third semiconductor interposer and the top semiconductor interposer may be direct ohmic contacts. An electrically insulating layer may be disposed either between the first semiconductor interposer and the second semiconductor interposer, between the second semiconductor interposer and the third semiconductor interposer, or between the third semiconductor interposer and the top semiconductor interposer. The electrically insulating layer may be configured to only pass electrical signals wirelessly through the electrically insulating layer. The first through substrate vias are electrically connected to a printed circuit board disposed below the first semiconductor interposer.

Embodiments disclosed herein pertain to electronic packages including a motherboard. The embodiments further include a first semiconductor interposer electrically coupled to the motherboard by a first plurality of electrical connections. The first semiconductor interposer includes a first plurality of through substrate vias perpendicular to the major plane of the first semiconductor interposer and passing through the entire thickness of the first semiconductor interposer. The first through substrate vias are electrically connected to a portion of the first plurality of electrical connections. A spacing between the first semiconductor interposer and the motherboard is less than 800 μm according to embodiments. The embodiments further include a second semiconductor interposer electrically coupled to the first semiconductor interposer by a second plurality of electrical connections. The second plurality of electrical connections includes one of thermo-compression bonding, copper pillar and solder bumps. A spacing between the second semiconductor interposer and the first semiconductor interposer is less than 150 μm. A first pitch of the first plurality of electrical connections is between 200 μm and 3 mm. A second pitch of the second plurality of electrical connections is between 10 μm and 100 μm. The embodiments further include a third semiconductor interposer electrically coupled to the second semiconductor interposer. The third semiconductor interposer is laterally shifted relative to the first semiconductor interposer and the top semiconductor interposer to form an interposer overhang portion. A wirebond attachment is disposed between the interposer overhang portion and the motherboard to provide additional electrical connections complementing electrical connections between the third semiconductor interposer and the second semiconductor interposer and between the third semiconductor interposer and the top semiconductor interposer. The embodiments further include a top semiconductor interposer electrically coupled to the third semiconductor interposer. The top semiconductor interposer has no through substrate vias and no electrical connections on top. The top semiconductor interposer has electrical routing circuitry on the bottom.

Additional embodiments and features are set forth in part in the description that follows, and in part will become apparent to those skilled in the art upon examination of the specification or may be learned by the practice of the disclosed embodiments. The features and advantages of the disclosed embodiments may be realized and attained by means of the instrumentalities, combinations, and methods described in the specification.

DESCRIPTION OF THE DRAWINGS

A further understanding of the nature and advantages of the embodiments may be realized by reference to the remaining portions of the specification and the drawings.

In the appended figures, similar components and/or features may have the same reference label. Further, various components of the same type may be distinguished by following the reference label by a dash and a second label that distinguishes among the similar components. If only the first reference label is used in the specification, the description is applicable to any one of the similar components having the same first reference label irrespective of the second reference label.

DETAILED DESCRIPTION

Integrated circuits are described which directly connect a semiconductor interposer to a printed circuit board or motherboard by way of a large pitch array, e.g. ball grid arrays (BGA). No non-semiconductor layer (e.g. no organic package substrate) exists between the semiconductor interposer and the motherboard or printed circuit board in embodiments. A stack of semiconductor interposers may be connected directly to one another and connected to a printed circuit board through only a ball grid array of solder bumps. The stack of semiconductor interposers may include one or more semiconductor interposers which are shifted left or right to enable wirebond connections or copper pillar connections to be made directly to intermediate semiconductor interposers which would otherwise only make electrical connections to the semiconductor interposer directly above or below. The top semiconductor interposer may have no electrical connections on the top to increase security by making electrical "taps" much more difficult. An electrically insulating layer may be incorporated between adjacent semiconductor interposers and cavities or air gaps may also be included within one or more semiconductor interposers to improve cooling and/or mount additional circuit elements.

Integrated circuits have been formed by placing an organic package substrate between the printed circuit board and a silicon interposer to step down the pitch. The printed circuit board may have a pitch near 1 mm, the organic package substrate may have a pitch near 200 μm and the silicon interposer may have a pitch less than 50 μm. The organic package substrate may also be included to provide structure for the thinned silicon interposers used to date. The integrated circuits described herein may use thicker silicon interposers to provide greater rigidity and forego the organic package substrate. The large pitch of the printed circuit board is stepped down in one step to the pitch of a semiconductor interposer in embodiments. The printed circuit board may have a ball grid array pitch of between 200 μm and 3 mm, between 300 μm and 2 mm or between 0.5 mm and 1.5 mm in embodiments. The semiconductor interposer may be a silicon interposer according to embodiments. The integrated circuits described herein involve only one level of pitch transformation from the ball grid array pitches recited down to a semiconductor interposer pitch of between 10 μm and 100 μm, between 15 μm and 100 μm, or between 20 μm and 60 μm in embodiments.

Integrated circuits formed in the manner described herein possess improved reliability, in part, due to an improvement in solder joint reliability and a reduction in warpage. Incorporating a thicker semiconductor interposer reduces the tendency to warp. Warping may occur during the wafer processing and thinning of the semiconductor interposer. The second opportunity for warping occurs during the packaging and assembly. The chance of warping increases for larger interposer lengths and package dimensions which is currently necessary for a variety of 2.5D/3D integration applications (e.g. networking). Beyond reliability, lower cost and higher performance devices are enabled as described subsequently. The devices may also be made smaller due to the elimination of multiple layers of material. An innovation which introduces greater reliability, lower cost, higher performance and concurrently reduces size is very rare. Each of these fundamental improvements are often made at the sacrifice of the other three.

Figure 2:
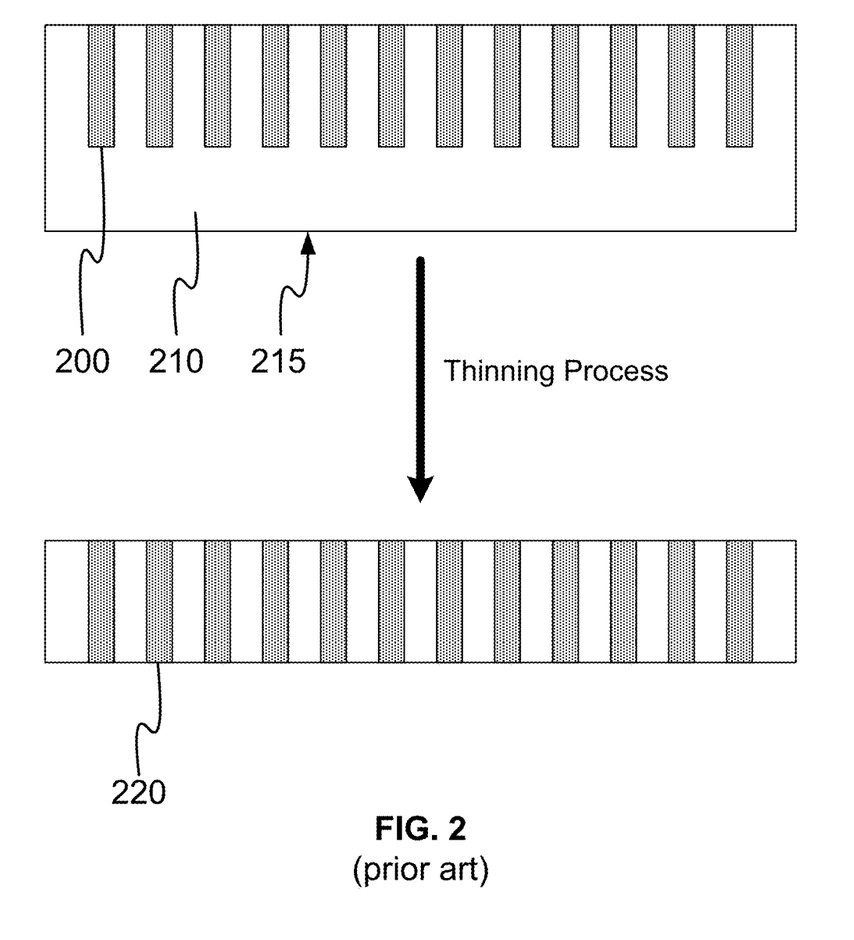
FIG. 2 is a schematic before and after thinning an interposer to form through-substrate vias (TSVs) according to the prior art.

A typical semiconductor interposer manufacturing flow is shown in FIG. 2. Blind vias 200 with of desired diameter (e.g. 10 μm) are created within wafer 210 followed by back-grinding wafer 210 from the bottom 215 to a thickness (e.g. 100 μm) which exposes the through substrate vias (TSV) 220. When formed in silicon the through substrate vias may be referred to as through silicon vias. A semiconductor interposer formed with 10 μm diameter vias and a 100 μm thick semiconductor interposer is said to have a 10:100 aspect ratio. This process may be referred to as a "wafer thinning and via reveal process". In practice, not all the blind vias are etched with equal depth. There may be considerable variation in blind via depth due to process variation. With more than 2 μm variation in blind via depth, considerable contamination occurs during the backgrinding process used to thin the semiconductor interposer to final thickness and reveal the blind vias. Thinning the semiconductor interposer to reveal the vias may negatively impact the yield. Low yields increase costs and are thought to have delayed the broad introduction of 2.5D/3D integration into the market.

Figure 3:
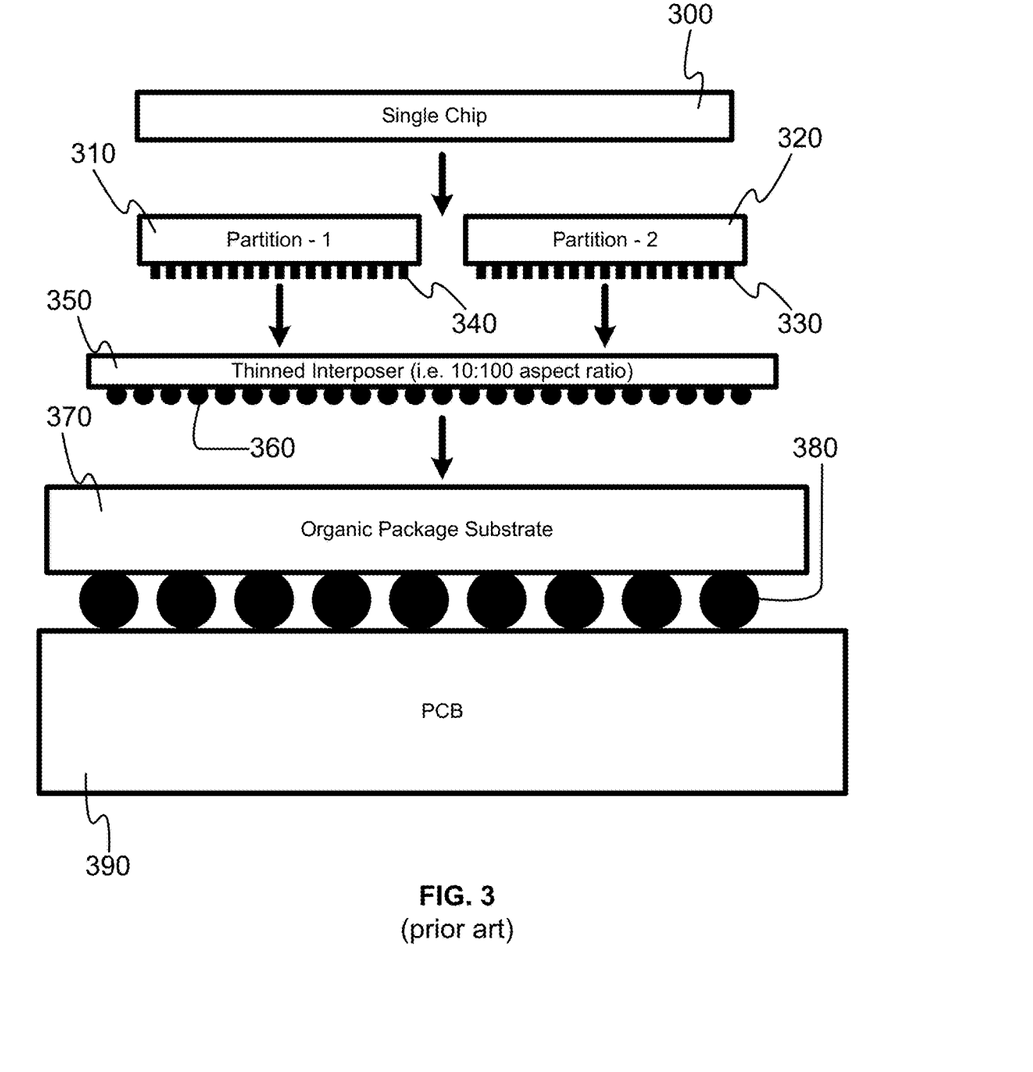
FIG. 3 is a schematic of a 2.5D/3D integration using a thin interposer according to the prior art.

FIG. 3 shows a conventional 2.5D/3D integration and assembly. A single chip 300 is partitioned into multiple other chips or so called partitions (310, 320). Partitions (310, 320) may be homogeneous or heterogeneous. Partitions (310, 320) are then bumped using copper pillar bumping technology to form copper pillars (330, 340). Copper pillars (330, 340) are used for bump pitches which may be less than 80 μm. Partitions (330, 340) are assembled on a thin silicon interposer 350 with typical aspect ratio of 10:100. The bottom of the silicon interposer may have a typical bump pitch of 150 μm or more to comply with a current industry standard flip chip bump pitch. The bottom of the silicon interposer may be bumped using solder bump material 360. Silicon interposer 350 is then assembled on organic substrate 370. Ball Grid Array (BGA) 380 with typical pitch of about 1 mm is attached to the back side of organic substrate 370. Organic substrate 370 is then assembled on Printed Circuit Board (PCB) 390.

Described herein is a low cost, high performance and reliable 2.5D/3D integration technology which improves upon the device depicted in FIG. 3. To better understand and appreciate the embodiments described herein, reference is now made to FIG. 4 which is a schematic of a 2.5D/3D integration using a thick interposer according to embodiments described herein. A thick semiconductor interposer 460 is used in place of the thinned silicon interposer 350 of FIG. 3 and attached directly to printed circuit board 470 by way of ball grid array 460. Thick semiconductor interposer 460 is much more rigid than a conventional thinned silicon interposer which enables the direct attachment to printed circuit board 470. A thickness of semiconductor interposer 460 may be greater than 150 μm, greater than 200 μm or greater than 250 μm in embodiments. Semiconductor interposer 460 may be placed directly on PCB 470 eliminating the need for an intermediary substrate such as organic substrate 370 of FIG. 3. Single chip 400 is partitioned into homogeneous or heterogeneous partitions (410, 420) and bumped using copper pillars (430, 440). Copper pillars 430 and/or 440 may have a bump pitch of less than 100 μm, less than 80 μm, less than 65 μm, less than 55 μm or less than 45 μm according to embodiments. Partitions (410, 420) are assembled on the more rigid thick silicon interposer 450 with BGA ball pitch of between 200 μm and 3 mm followed by assembly on PCB 470.

When describing all embodiments here, "Top" and "Up" will be used herein to describe portions/directions perpendicularly distal from the printed circuit board (PCB) plane and further away from the center of mass of the PCB in the perpendicular direction. "Vertical" will be used to describe items aligned in the "Up" direction towards the "Top". Other similar terms may be used whose meanings will now be clear.

Figure 4:
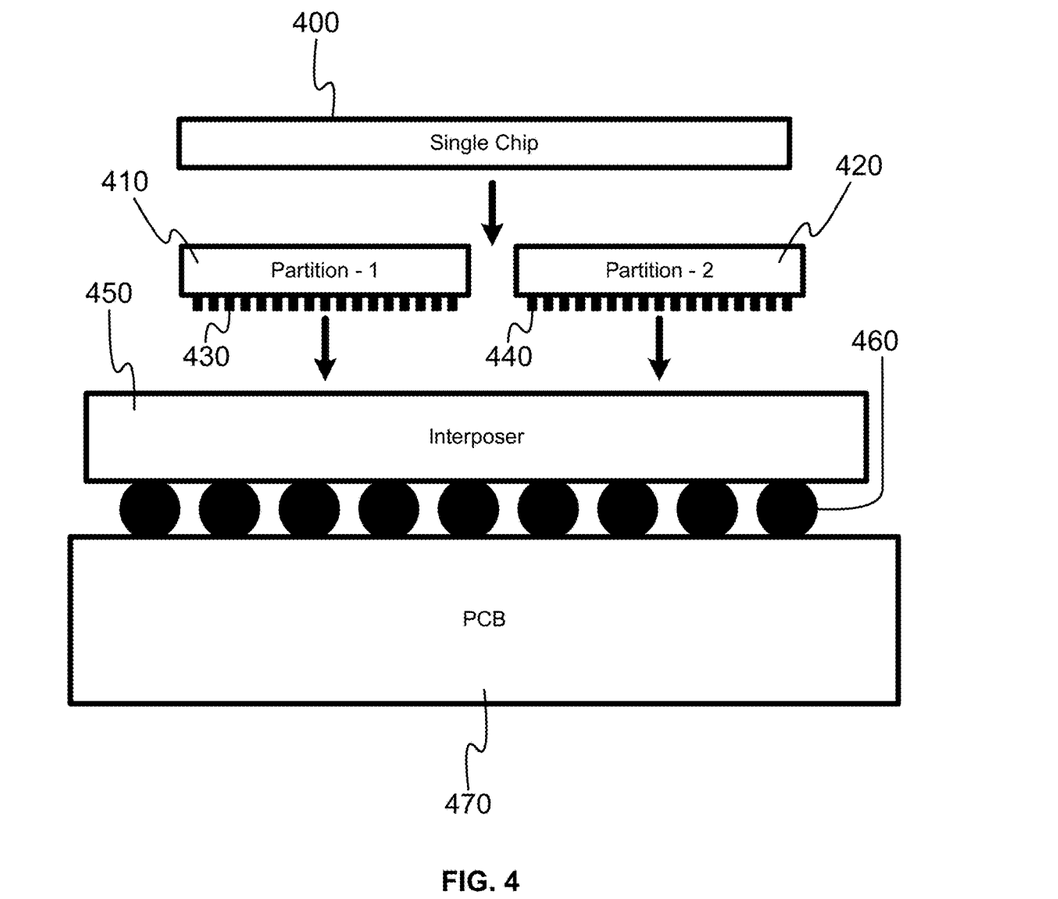
FIG. 4 is a schematic of a 2.5D/3D integration using a thick interposer according to embodiments.

A benefit of the embodiments described herein include a reduction in backgrinding to thin interposer substrates in addition to the issues created by incorporating thinned substrates into an integrated circuit package. Forty percent of the cost associated with manufacturing silicon interposers may be attributed to wafer thinning and back-grinding as well as the via reveal process. Manufacturing conventional thin silicon interposer may ultimately include each of wafer thinning and TSV reveal process (19% of the total packaging cost), wafer bonding and debonding process which is necessary for TSV reveal process (20%) and TSV copper via fill process (19%). The three processes together contribute almost sixty percent of the total cost of manufacturing. Benefits of the embodiments disclosed herein may remove the time and costs associate with wafer thinning and TSV reveal processes, wafer bonding/debonding processes and copper TSV via fill processes. Another benefit of implementing the rigid interposers directly on the PCB is that the architecture may remove the need for a multi-layer organic substrate as shown in FIG. 4 and further reduce costs.

Another conventional architecture problem is a reduction in yield for large size interposers. Larger size interposers tend to warp easier both during wafer processing as well as packaging and assembly thus resulting in lower yield products. A benefit of the packaging architecture presented herein is large interposers are more rigid. Warping is reduced and yields are increased through the use of thick and rigid interposers.

Thick and rigid interposers also enable 2.5D/3D integration to be conducted on much larger platforms. Direct integration of rigid interposers on a PCB can enable broader segment of the market such as networking and computing applications which require larger size interposers. The interposers may have an area greater than 30 mm$^2$, greater than 50 mm$^2$, greater than 80 mm$^2$, greater than 100 mm$^2$, or greater than 150 mm$^2$ according to embodiments. The product development time is also lowered using the packaging architecture described herein by reducing the number of assembly steps, facilitating rework and reducing processing costs.

Underfill is a term given to a process associated with conventional organic substrate architectures. The structural rigidity is increased by filling the region around the ball grid array with additional structural material. A further benefit of the architectures presented herein include the ability to eliminate the underfill (and therefore reduce cost) since the rigid silicon interposer may provide the necessary structure in embodiments. Thermal conductivity is also improved by incorporating a rigid silicon interposer directly on the PCB since the organic substrate has a lower thermal conductivity. Performance may be increased by the availability of the additional thermal overhead. However, performance may also be increased simply by the elimination of the additional electrical path length associated with the presence of the organic substrate.

To establish the benefits of the embodiments described herein, a 10×10 mm$^2$ rigid silicon interposer test vehicle was designed and fabricated for 200 mm wafers. During one run, the rigid silicon interposer's top side was designed for electrical characterization of Ser/Des interfaces as well as wide I/O and High Band Width (HBM) memory interfaces. During another experiment, the rigid silicon interposer's top side was designed with a 50 µm pitch mask bump pads, suitable for copper pillar integration. The bottom side of the interposer was designed with a 1 mm pitch mask of BGA pads for ease of direct integration onto a PCB. Electrical routing was performed on both sides of the interposers with ~5-10 µm on top side and ~15-20 µm bottom side copper metallization thicknesses. Following manufacturing and inspections, wafers were diced using a diamond saw machine. The BGA side of the rigid silicon interposers were bumped with eutectic solder balls through a reflow process. A 50×50 mm$^2$ FR-4 PCB with similar BGA pad size and mask opening was designed and manufactured. Bumped thick silicon interposers were than assembled on a 50×50 mm$^2$ FR-4 board through a reflow process. A series of x-ray images were taken between the interposer BGA ball and PCB to visually inspect and detect any solder joint anomalies. Assembled samples were then prepared for the underfill process. an ultrasonic cleaning procedure was performed before applying the underfill. The units were then baked at 150° C. for 1 hour followed by a plasma clean procedure. Standard flip chip underfill (8439-1) was applied and then all samples were cured at 150° C. for 90 minutes. Three samples were assembled two with underfill and one without underfill. Samples were then put through JEDEC specified temperature cycle stress test as specification. CSAM images were taken and analyzed at 250, 500, 750 and 1000 cycles. No anomalies were observed during temperature cycle CSAM inspection. All samples successfully passed the temp cycle stress test after 1000 cycles. The rigid interposer concept has been directly assembled on a PCB without the underfill and shown to result in higher performance, lower cost, enhanced thermal integrity and a robust reliable interposer that mitigates warpage.

Figure 5:
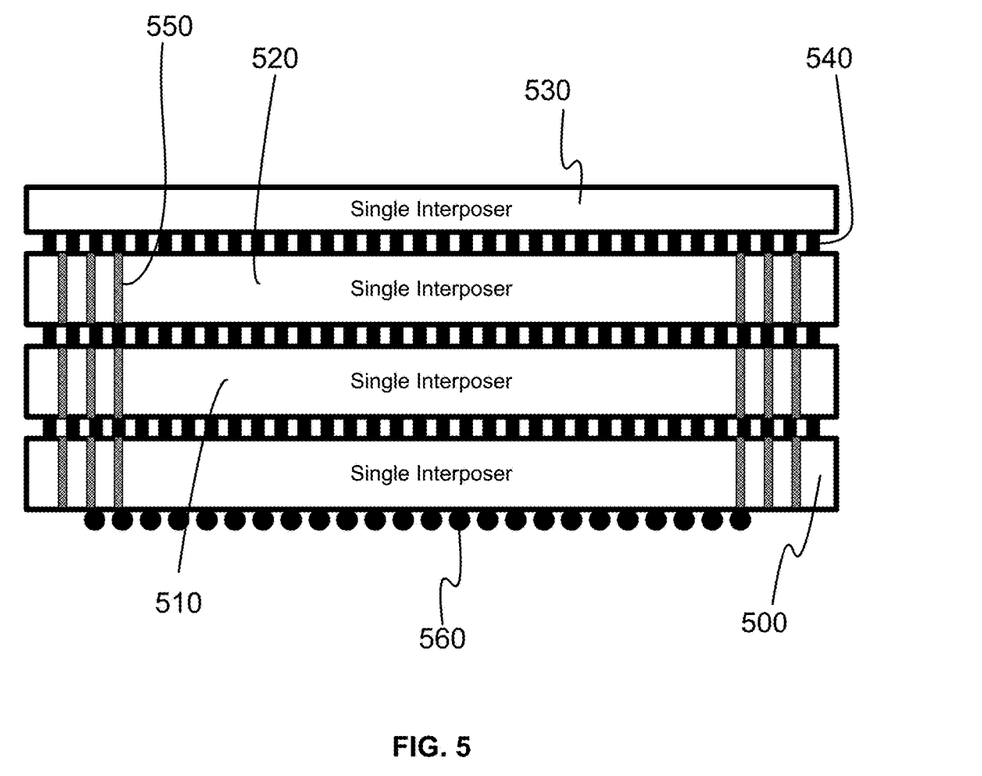
FIG. 5 is a schematic of a stack of interposers electrically connected using copper pillars according to embodiments.

FIG. 5 is a schematic of a stack of interposers electrically connected using copper pillars according to embodiments. A series of interposers (500, 510, 520, 530), each having TSVs 550, are attached to one another and to solder bumps 560 which may be attached to a PCB (not shown). Note that not all the interposers need to be the same thickness since the rigidity of the assembly is already provided for by the one or more thick semiconductor interposers in embodiments. Semiconductor interposer 530 is a thin interposer which has no electrical connection points on top/may have no through silicon vias as shown in FIG. 5. Semiconductor interposer 530 may have electrical routing pathways on the bottom despite having no electrical connections running from bottom to the top. The absence of electrical connection points on top increase the security of the completed device by making probing difficult during the devices' useful lifespan. Semiconductor interposer 500 may be attached to semiconductor interposer 510 by copper pillars 540 as shown. Similarly semiconductor interposers (510 and 520) may be attached to semiconductor interposers (520 and 530 respectively) using copper pillars 540. The architecture shown in FIG. 5 increases the routing density and enables tighter communication among the interposers as each interposer (500, 510 and 520) can have routing on the top and bottom layers. Passive components such as capacitors, resistors or inductor can be embedded or mounted on each interposer (500, 510, 520 and 530). A further benefit of all semiconductor interposer stacks described herein is increased reliability as a result of matching the materials—the coefficients of thermal expansion are the same if the semiconductor interposers are made from the same semiconducting material.

Figure 6:
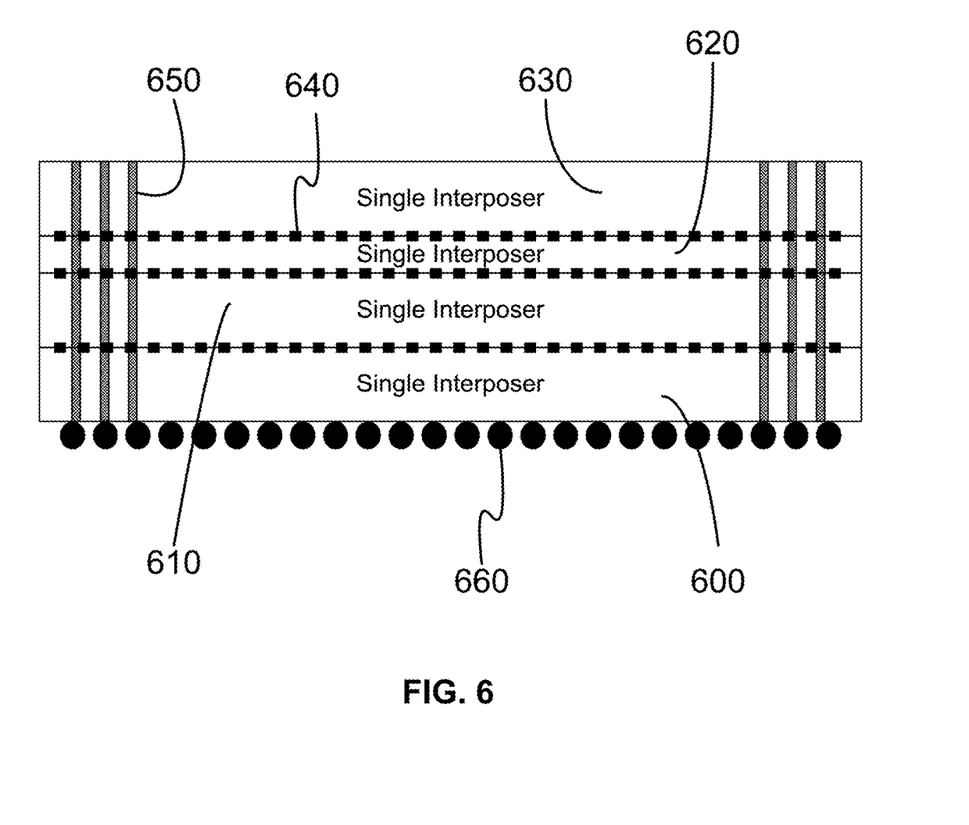
FIG. 6 is a schematic of a stack of interposers electrically connected using thermocompression bonding according to embodiments.

FIG. 6 is a schematic of a stack of semiconductor interposers electrically connected using thermos compression bonding according to embodiments. A series of interposers (600, 610, 620, 630) with some thick (600, 610, 630) and one thin (620) and each having TSVs 650 are stacked using thermo-compression bonding mechanism to bond the interposers face-to-face (630). The packaged integrated circuit architecture shown may have no copper pillars or solder bumps at any layer between the bottom semiconductor interposer 600 and the top semiconductor interposer 630 according to embodiments. The absence of copper pillars and solder bumps creates a lower profile rigid interposer. Security may also be improved. An intruder may be prevented from inserting a probe into the spaces which would ordinarily have gaps which accommodate copper pillars or solder bumps. An attempt to access and intercept or tap into the signal communication among interposers may be thwarted in embodiments. The architecture shown in FIG. 6 creates a more secure rigid interposer because the interfaces connecting the interposers are buried and not exposed. The semiconductor interposer stack of FIG. 6 may be assembled on a PCB (not shown) or other substrates using copper pillar, solder balls or thermo-compression bonding 640. Combinations of thermo-compression bonding, copper pillar and solder bumps can be used to form a rigid interposer according to embodiments.

Figure 7:
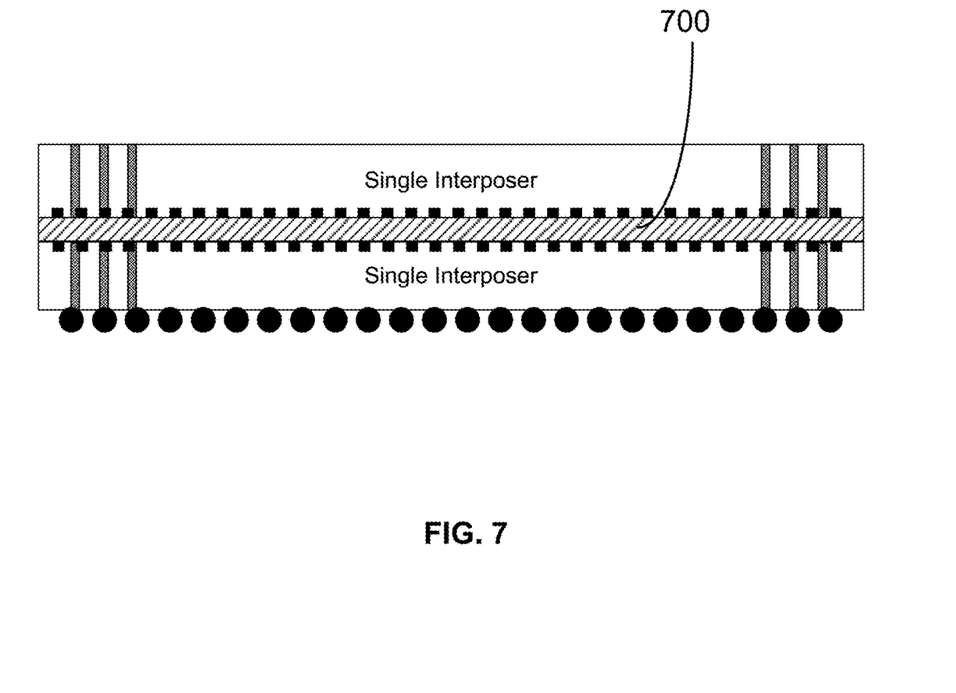
FIG. 7 is a schematic of a stack of interposers using an oxide layer for rigidity according to embodiments.
Figure 8A:
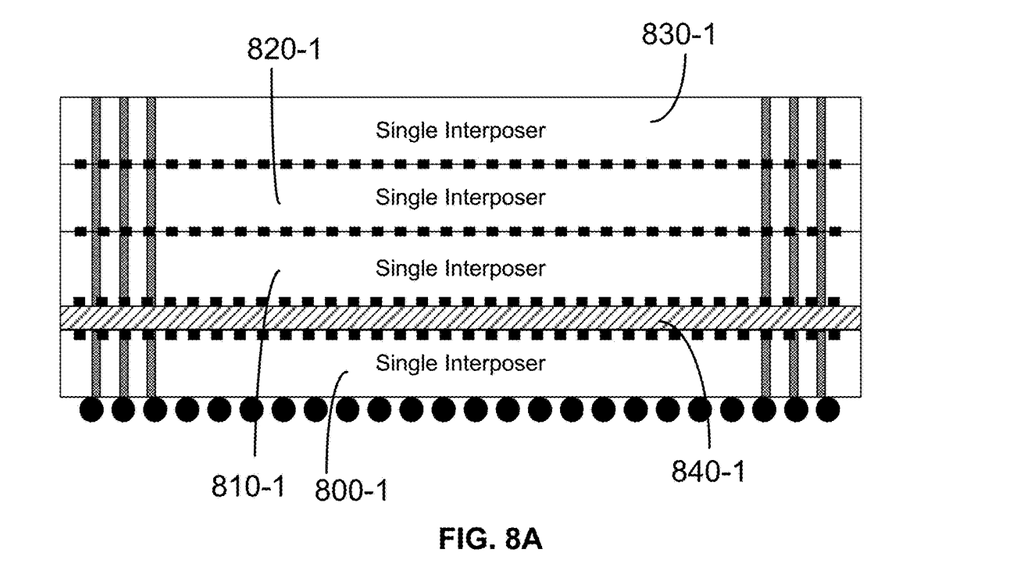
FIG. 8A is a schematic of a stack of interposers using an oxide layer for rigidity according to embodiments.
Figure 8B:
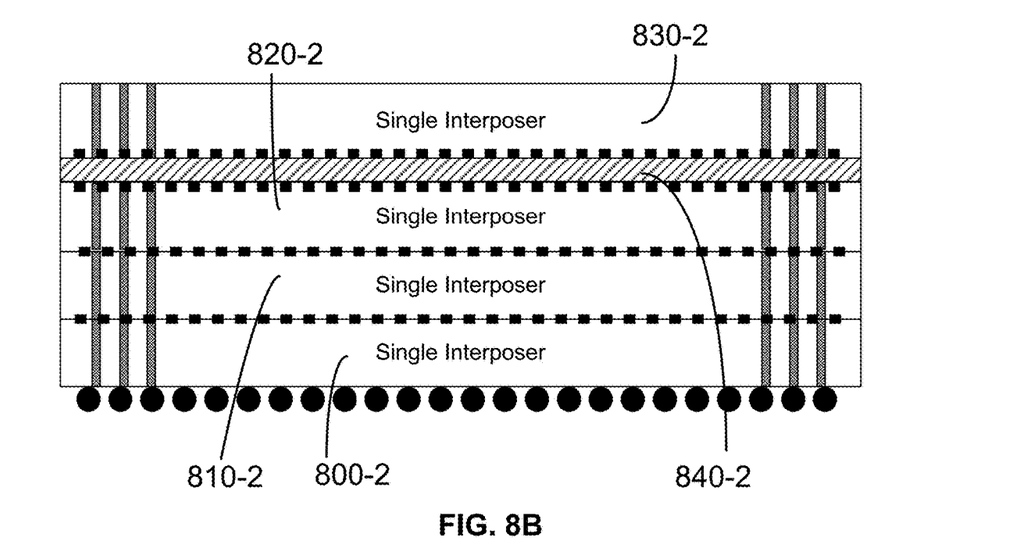
FIG. 8B is a schematic of a stack of interposers using an oxide layer for rigidity according to embodiments.

FIG. 7 is a schematic of a stack of interposers using incorporating a silicon oxide layer (700) according to embodiments. Generally speaking, a silicon oxide layer may be a rigid electrically insulating layer in all examples described herein. An integrated circuit packing incorporating a silicon oxide layer may exhibit even greater rigidity than an interposer stack consisting only of interposers and their electrical connections. Electrical signals may be transmitted through the thin silicon oxide layer inductively or capacitively in embodiments. Including the silicon oxide layer may also reduce a risk of electro-static discharge (ESD). As shown in FIG. 8A-8B, silicon oxide layers may be placed between any pair of adjacent interposers in a semiconductor interposer stack of an integrated circuit package. Silicon oxide layer 840-1 is shown between semiconductor interposer 800-1 and semiconductor interposer 810-1 in FIG. 8A. Silicon oxide layer 840-2 is shown incorporated between semiconductor interposer 820-2 and semiconductor interposer 830-2 in FIG. 8B. Multiple silicon oxide layers may also be incorporated at multiple locations within the semiconductor interposer stack in embodiments.

Figure 9A:
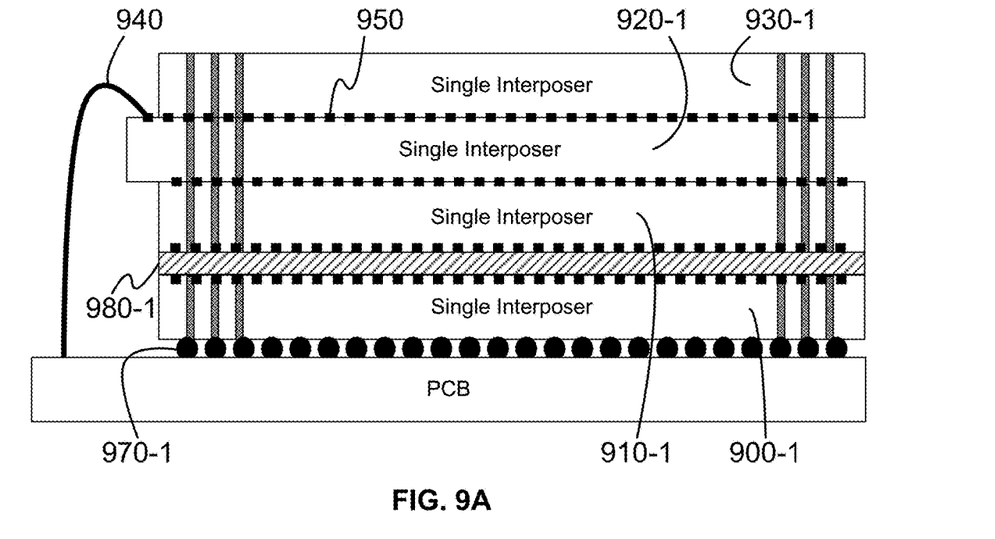
FIG. 9A is a schematic of a stack of silicon interposers using a spatially shifted interposer according to embodiments.
Figure 9B:
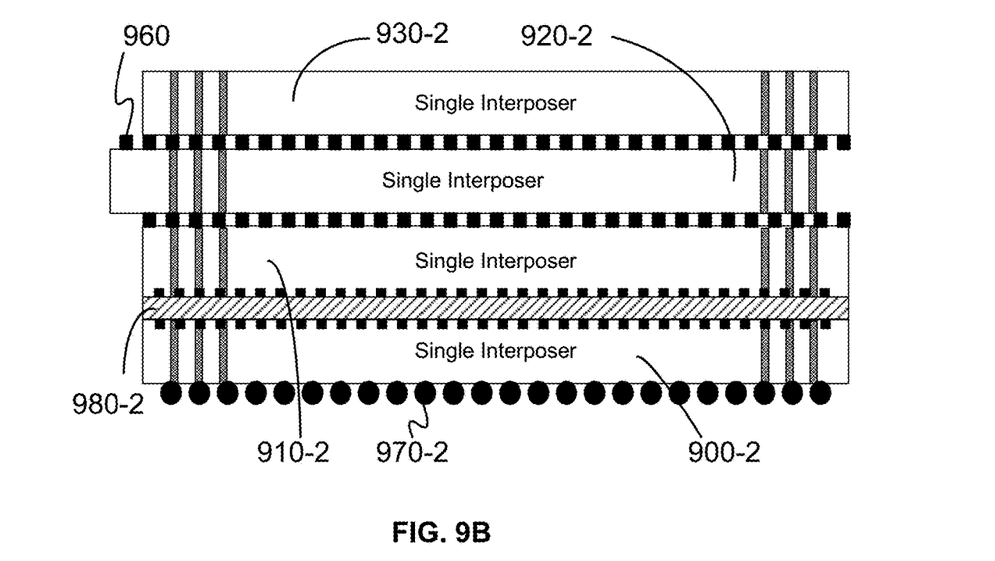
FIG. 9B is a schematic of a stack of silicon interposers using a spatially shifted interposer according to embodiments.

FIGS. 9A and 9B are schematics of a two exemplary stacks of semiconductor interposers using a spatially shifted interposer according to embodiments. One interposer (920) can extend longitudinally relative to the rest of the semiconductor interposer stack (900, 910 and 930) to provide clearance for wirebonding the interposer to the PCB using wirebond 940. The clearance may also allow for probing the interposer for testing, data collection and measurement. Semiconductor interposer stacks may be formed using mixed combination of face-to-face thermo-compression bonds 950, copper pillars 960, solder bumps 970 as well as oxide bonding 980. Semiconductor interposer stacks may incorporate more than one shifted interposer, in embodiments, and then wirebond connections may be made directly from one interposer to another. Thus, two semiconductor interposers may be electrically connected in addition to the face-to-face electrical contacts made with thermos-compression bonds 950, copper pillars 960 and solder bumps 970 according to embodiments. The additional flexibility afforded by wirebonding may be used to increase the number of signals which are passed from one semiconductor interposer to another semiconductor interposer beyond the limitation dictated by the TSV pitch. The number of signals between a semiconductor interposer and the printed circuit board may similarly be increased using wirebonding according to embodiments. Wirebonding may provide the added benefit of improved signal/power integrity for appropriate electrical signals.

Figure 10A:
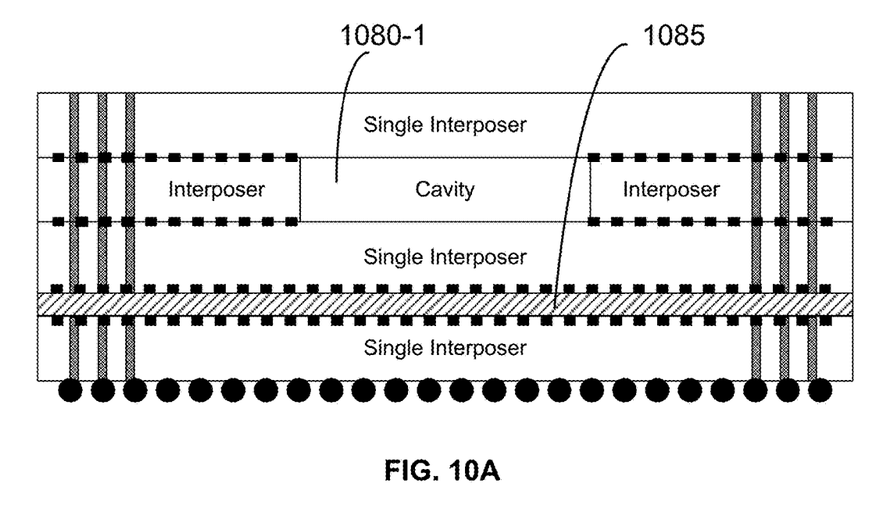
FIG. 10A is a schematic of a stack of silicon interposers incorporating a cavity according to embodiments.
Figure 10B:
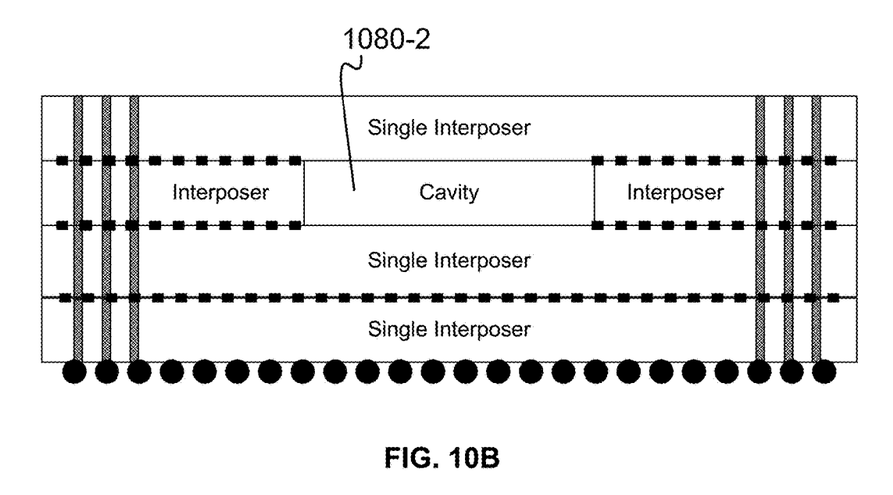
FIG. 10B is a schematic of a stack of silicon interposers incorporating a cavity and an electrically insulating layer according to embodiments.
Figure 11:
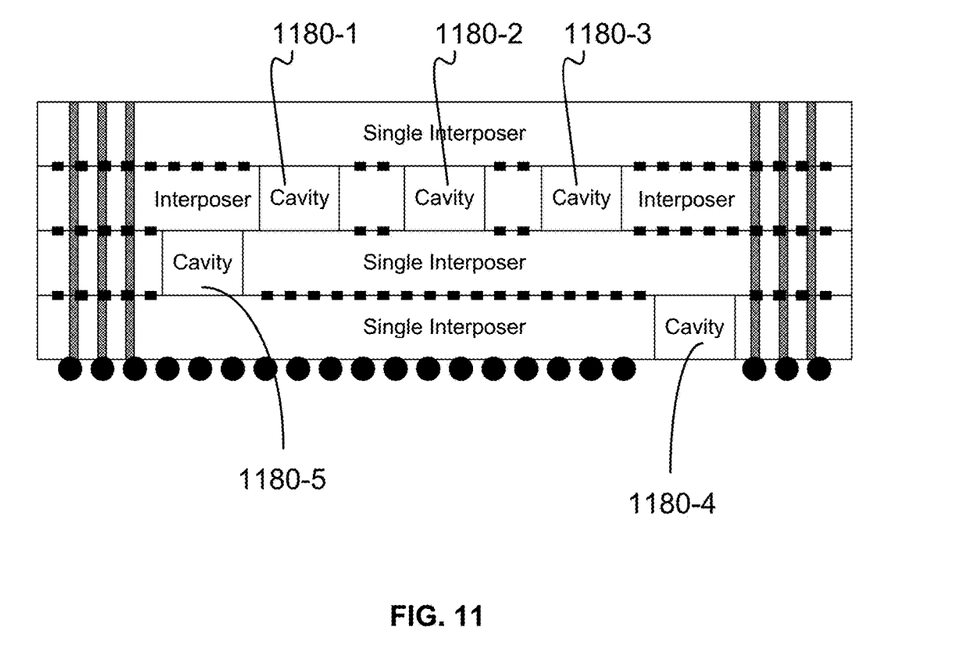
FIG. 11 is a schematic of a stack of silicon interposers incorporating cavities according to embodiments.

FIGS. 10A and 10B are schematics of a stack of silicon interposers incorporating a cavity and an electrically insulating layer according to embodiments. A cavity 1080-1 is incorporated into a semiconductor interposer stack in FIG. 10A. A rigid electrically insulating layer 1085 is also shown in the semiconductor interposer stack. FIG. 10B shows a semiconductor interposer stack with a cavity 1080-2 but without a rigid electrically insulating layer 1085. Including a cavity in a semiconductor interposer stack provides a channel for air flow and helps in cooling the interposer as well as the chip in embodiments. Including a cavity may also provide a location to mount circuit elements of various types (passives, devices or chips) within the semiconductor interposer stack. FIG. 11 is a schematic of a stack of silicon interposers incorporating multiple cavities according to embodiments. A semiconductor interposer stack may include a semiconductor which contains no cavities, one cavity or multiple cavities according to embodiments, each of which is displayed in FIG. 11.

All circuit elements may have major planes which are parallel to all other circuit elements described herein according to embodiments. Placing semiconductor interposers next to one another and making direct electrical contact between neighboring semiconductor interposers has been described herein. As such, the neighboring (or adjacent) semiconductor interposers may be closely spaced. The spacing between one semiconductor interposer and a neighboring semiconductor interposer may be less than 150 μm, less than 120 μm, less than 50 μm, or less than 35 μm according to embodiments. The neighboring semiconductor interposers may in contact with one another in which case the spacing will be considered zero microns. Regardless of the type of electrical connections used to form electrical connections between the first semiconductor interposer and the second neighboring semiconductor interposer, only a single metal layer may be present between them in embodiments. Similarly, there may be only a single metal layer present connecting the bottom semiconductor interposer and the printed circuit board according to embodiments. The electrical connection between the bottom semiconductor interposer the printed circuit board may consist only of a single ball grid array in embodiments. The spacing between bottom semiconductor interposer and the printed circuit board may be less than 800 μm, less than 650 μm, or less than 400 μm according to embodiments.

Having disclosed several embodiments, it will be recognized by those of skill in the art that various modifications, alternative constructions, and equivalents may be used without departing from the spirit of the disclosed embodiments. Additionally, a number of well-known processes and elements have not been described to avoid unnecessarily obscuring the embodiments described herein. Accordingly, the above description should not be taken as limiting the scope of the claims.

Where a range of values is provided, it is understood that each intervening value, to the tenth of the unit of the lower limit unless the context clearly dictates otherwise, between the upper and lower limits of that range is also specifically disclosed. Each smaller range between any stated value or intervening value in a stated range and any other stated or intervening value in that stated range is encompassed. The upper and lower limits of these smaller ranges may independently be included or excluded in the range, and each range where either, neither or both limits are included in the smaller ranges is also encompassed within the embodiments described, subject to any specifically excluded limit in the stated range. Where the stated range includes one or both of the limits, ranges excluding either or both of those included limits are also included.

As used herein and in the appended claims, the singular forms "a", "an", and "the" include plural referents unless the context clearly dictates otherwise. Thus, for example, reference to "a process" includes a plurality of such processes and reference to "the dielectric material" includes reference to one or more dielectric materials and equivalents thereof known to those skilled in the art, and so forth.

Also, the words "comprise," "comprising," "include," "including," and "includes" when used in this specification and in the following claims are intended to specify the presence of stated features, integers, components, or steps, but they do not preclude the presence or addition of one or more other features, integers, components, steps, acts, or groups.

The invention claimed is:

1. An integrated circuit package comprising:
   a first semiconductor interposer comprising a first plurality of through vias substantially perpendicular to a major plane of the first semiconductor interposer and extending through an entire thickness of the first semiconductor interposer; and
   a second semiconductor interposer positioned below said first semiconductor interposer, said second interposer comprising a second plurality of through vias substantially perpendicular to a major plane of the second semiconductor interposer and extending through an entire thickness of the second semiconductor interposer, wherein
   the entire surface of a lower semiconductor surface of the first semiconductor interposer is directly connected to an upper surface of a silicon oxide layer and a bottom surface of the silicon oxide layer is directly connected to the entire surface of an upper semiconductor surface of the second semiconductor interposer, and
   electrical signals are transmitted through the silicon oxide layer inductively or capacitively between the first semiconductor interposer and the second semiconductor interposer.

2. The integrated circuit package of claim 1 wherein the first and second semiconductor interposers have different thicknesses.

3. The integrated circuit package of claim 1 wherein at least one of the first and second semiconductor interposers comprises a passive component selected from a group consisting of a resistor, capacitor and inductor.

4. The integrated circuit package of claim 3 wherein the passive component is embedded in the at least one of the first and second semiconductor interposers.

5. The integrated circuit package of claim 1 wherein the second semiconductor interposer is laterally shifted relative to the first semiconductor interposer.

6. The integrated circuit package of claim 1 wherein at least one of the first and second semiconductor interposers comprises a cavity.

7. The integrated circuit package of claim 1 further comprising at least one integrated circuit positioned above the first semiconductor interposer and either transmitting or receiving signals via the first and second plurality of through vias.

8. A method of forming an integrated circuit package, the method comprising:
   forming a first plurality of through vias through an entire thickness of a first semiconductor interposer;
   directly connecting the entire surface of a lower semiconductor surface of the first semiconductor interposer to an upper surface of a silicon oxide layer;
   directly connecting a bottom surface of the silicon oxide layer to the entire surface of an upper semiconductor surface of the second semiconductor interposer; and
   forming a second plurality of through vias through an entire thickness of the second semiconductor interposer, wherein
   electrical signals are transmitted through the silicon oxide layer inductively or capacitively between the first semiconductor interposer and the second semiconductor interposer.

9. The method of claim 8 wherein the first and second semiconductor interposers have different thicknesses.

10. The method of claim 8 further comprising:
    mounting a passive component selected from a group consisting of a resistor, capacitor and inductor on at least one of the first and second semiconductor interposers.

11. The method of claim 10 further comprising:
    embedding a passive component selected from a group consisting of a resistor, capacitor and inductor in at least one of the first and second semiconductor interposers.

12. The method of claim 8 further comprising:
    laterally shifting the second semiconductor interposer relative to the first semiconductor interposer.

13. The method of claim 8 further comprising:
    forming a cavity in at least one of the first and second semiconductor interposers.

14. The method of claim 8 further comprising:
    positioning at least one integrated circuit above the first semiconductor interposer, said integrated circuit either transmitting or receiving signals via the first and second plurality of through vias.

* * * * *

UNITED STATES PATENT AND TRADEMARK OFFICE
CERTIFICATE OF CORRECTION

PATENT NO. : 9,893,004 B2  
APPLICATION NO. : 14/717798  
DATED : February 13, 2018  
INVENTOR(S) : Farhang Yazdani Page 1 of 1

It is certified that error appears in the above-identified patent and that said Letters Patent is hereby corrected as shown below:

On the Title Page

Item (63), Related U.S. Application Data:  
Please delete "Continuation-in-part of application No. 13/192,217, filed on Jul. 27, 2011."

And replace with:  
--Continuation-in-part of application No. 13/192,217, filed on Jul. 27, 2011, which is a continuation of application No. 12/205,875, filed on Sep. 6, 2008, now Pat. No. 8,014,166.--

Signed and Sealed this  
Seventeenth Day of April, 2018

Andrei Iancu  
*Director of the United States Patent and Trademark Office*